United States Patent
Green et al.

[11] Patent Number: 6,028,429
[45] Date of Patent: Feb. 22, 2000

[54] COMPOSITE MRI ANTENNA WITH REDUCED STRAY CAPACITANCE

[75] Inventors: Charles Green, Holbrook; Jan Votruba, Ridge; Gregory Eydelman, West Hempstead; Raymond V. Damadian, Woodbury, all of N.Y.

[73] Assignee: Fonar Corporation, Melville, N.Y.

[21] Appl. No.: 08/895,674

[22] Filed: Jul. 17, 1997

Related U.S. Application Data

[60] Provisional application No. 60/021,943, Jul. 17, 1996.

[51] Int. Cl.[7] ..................................................... G01V 3/00
[52] U.S. Cl. .......................... 324/318; 324/322; 600/412
[58] Field of Search ..................... 324/318, 309, 324/312, 322, 307; 600/412, 410

[56] References Cited

U.S. PATENT DOCUMENTS

| | | |
|---|---|---|
| 4,672,972 | 6/1987 | Berke . |
| 4,691,163 | 9/1987 | Blass et al. . |
| 4,737,712 | 4/1988 | Stormont et al. . |
| 4,829,252 | 5/1989 | Kaufman . |
| 4,875,485 | 10/1989 | Matsutani . |
| 4,920,318 | 4/1990 | Misic et al. . |
| 4,968,937 | 11/1990 | Akgun . |
| 5,024,229 | 6/1991 | Bryant et al. . |
| 5,035,231 | 7/1991 | Kubokawa et al. . |
| 5,050,605 | 9/1991 | Eydelman et al. . |
| 5,065,760 | 11/1991 | Krause et al. . |
| 5,177,443 | 1/1993 | Gilderdale . |
| 5,241,272 | 8/1993 | Friedrich . |
| 5,243,289 | 9/1993 | Blum et al. ............................ 324/322 |
| 5,245,286 | 9/1993 | Carlson et al. . |
| 5,280,249 | 1/1994 | Kess . |
| 5,303,707 | 4/1994 | Young . |
| 5,304,932 | 4/1994 | Carlson . |
| 5,361,764 | 11/1994 | Reynolds et al. . |
| 5,365,173 | 11/1994 | Zou et al. . |
| 5,378,988 | 1/1995 | Pulyer . |
| 5,435,302 | 7/1995 | Lenkinski et al. . |
| 5,462,055 | 10/1995 | Casey et al. . |
| 5,473,252 | 12/1995 | Renz et al. . |
| 5,490,513 | 2/1996 | Damadian et al. . |
| 5,575,287 | 11/1996 | Eydelman ............................ 128/653.5 |
| 5,583,438 | 12/1996 | Eydelman et al. ..................... 324/318 |

*Primary Examiner*—Christine K. Oda
*Assistant Examiner*—Brij B. Shrivastav
*Attorney, Agent, or Firm*—Lerner, David, Littenberg, Krumholz & Mentlik, LLP

[57] ABSTRACT

An antenna system for a magnetic resonance imaging apparatus has an active coil connected between a transmitter or receiver and ground and also has an isolated loop coil which is not conductively connected to ground. The isolated loop coil preferably overlies the electrically conductive pole surface of the field magnet. The isolated loop coil is inductively coupled to the active coil. The assembly has relatively low parasitic capacitance to ground and hence can be tuned to the resonant frequencies required for high field strength imaging.

14 Claims, 6 Drawing Sheets

COMPOSITE MRI ANTENNA WITH REDUCED STRAY CAPACITANCE

CROSS REFERENCE TO RELATED APPLICATIONS

The present application claims benefit of U.S. Provisional Application No. 60/021,943, filed Jul. 17, 1996, the disclosure of which is hereby incorporated by reference herein.

BACKGROUND OF THE INVENTION

The present provisional application relates to the field of magnetic resonance imaging or "MRI".

MRI is widely used in medical and other arts to obtain images of a subject such as a medical patient. The patient's body is placed within the subject-receiving space of a primary field magnet and exposed to a strong, substantially constant primary magnetic field, so that the nuclei spin around axes aligned with the magnetic field. Powerful radio frequency ("RF") signals are broadcast into the subject receiving space to excite atomic nuclei within the patient's body into nuclear magnetic resonance. The spinning nuclei generate minuscule RF signals, referred to herein as magnetic resonance signals. By applying magnetic field gradients so that the magnitude of the magnetic field varies with location inside the subject-receiving space, the magnetic resonance phenomenon can be limited to only a particular region or "slice" over the patient's body, so that all of the magnetic resonance signals come from that slice. Moreover, by applying such magnetic field gradients, characteristics of the magnetic resonance signals from different locations within the slice, such as the frequency and phase of the signals can be made to vary in a predictable manner depending upon position within the slice. Stated another way, the magnetic resonance signals are "spatially encoded" so that it is possible to distinguish between signals from different parts of a slice. After performing many excitations under different gradients, it is possible to derive a map showing the intensity or other characteristics of magnetic resonance signals versus position within the slice. Because these characteristics vary with the concentration of different chemical substances and other chemical characteristics of the tissue, different tissues provide different magnetic resonance signal characteristics. When the map of magnetic resonance signal characteristics is displayed in a visual format, such as on a computer screen or printed image the map forms a picture of the structures within the patient's body, with different tissues having different intensities or colors.

The RF excitation signals are normally applied by antennas fixed to the primary field magnet structure and arranged to provide substantially uniform excitation throughout the subject-receiving space. The RF excitation signals are provided by powerful radio transmitters. The magnetic resonance signals, which are many millions of times weaker than the RF excitation signals, can be received by antennas mounted on the primary field magnet or, more commonly, by antennas placed close to the area of the patient's body to be imaged.

A difficulty encountered with conventional RF transmitting antennas mounted on the primary field magnet relates to the electrical interaction between the antenna and the remaining structure of the magnet. Typically, RF transmitting antennas have been provided as coils arranged in a plane, with the plane of the coil closely overlying an electrically conductive part of the magnet structure, most typically the pole piece of the magnet. To conserve room within the subject receiving space and leave a large open area for the patient, it is desirable to place the coil as close as possible to the magnet structure. However, the transmitting antenna and the magnet structure cooperatively act as a capacitor. When the transmitting antenna is arranged in close proximity to the magnet structure, a so-called "parasitic capacitance" is introduced into the electrical circuit of the transmitting antenna. This, in turn, causes problems in tuning the antenna. To provide efficient RF signal propagation, the resonant frequency of the transmitting antenna circuit must be equal to the frequency of the RF excitation signals to be sent and hence, must be equal to the resonant frequency of the atomic nuclei. The resonant frequency of the antenna circuit is inversely related to the inductance and the capacitance present in the circuit as a whole. The antenna has electromagnetic inductance. Preferably, the parasitic capacitance of the antenna together with the inductance of the antenna provide an untuned resonant frequency higher than the desired resonant frequency to match the RF excitation frequency. It is a simple matter to connect an additional capacitor into the transmitting antenna circuit so as to reduce its resonant frequency and thereby match the resonant frequency of the antenna circuit to the RF excitation frequency. However, where the parasitic capacitance and the natural inductance of the antenna, without any added capacitance, yield a resonant frequency below the RF excitation frequency, the antenna circuit cannot be tuned to the RF excitation frequency.

Accordingly, it is desirable to minimize the parasitic capacitance of the antenna structure. This need is especially apparent where the apparatus is to operate at relatively high magnetic fields, such as at about 3 kilogauss or about 6 kilogauss, and hence operates at high radio frequencies, such as about 12 to about 25 megahertz or higher. The copending, commonly assigned U.S. Patent Application of Charles Green et al. entitled Magnetic Resonance Imaging Excitation and Reception Methods and Apparatus, Ser. No. 08/683, 623, filed Jul. 17, 1996 (the "Green et al. application") discloses an effective solution to this problem. The disclosure of said Green et al. application is hereby incorporated by reference herein. One of the teachings in the Green et al. application discloses the use of principal RF antennas mounted to the magnet structure. The principal RF antennas have windings defining coil surfaces substantially transverse and preferably perpendicular to the adjacent conductive surfaces of the primary field magnet. As used herein, the term "coil surface" refers to an imaginary surface defined by the central axes of the conductors constituting a coil or antenna. For example, in the particular case of a flat, loop-like coil lying in a plane, the coil surface is the plane of the coil. Other, more complex coil shapes may define curved coil surfaces. Thus, as used herein the term "coil surface" has the same meaning as in the Green et al. application. The Green et al. application also discloses the use of a local retransmitting antenna separate from the antenna for concentrating the RF energy applied by the principal antenna into the small region within the subject receiving space of the apparatus encompassing the region of interest within the patient or other subject to be scanned. For example, in some embodiments of the Green et al. application, the local retransmitting antenna may include a coil encircling a portion of the patient's body to be imaged.

Nonetheless, still further improvements and alternatives would be desirable. As more fully set forth in the Appendix below, parasitic capacitance between the windings of a coil and a conductive surface of the MRI apparatus is electrically equivalent to a capacitance in series with the coil. For a given physical configuration of the coil winding and conductive surface, having a given parasitic or stray capacitance per unit length of the winding or coil conductor, the effective capacitance will have one value ("C") where the coil has an end connected to the conductive surface as, for example, in the common case where one end of the coil is connected to ground and the conductive surface is also connected to ground. However, if the same coil, having the same parasitic capacitance per unit length is isolated from the conductive surface so that the coil is not conductively connected to the conductive surface, the equivalent capacitance will be reduced substantially to a value of C/4. That is, the effect of parasitic or stray capacitance is reduced by approximately ¾ where the coil is isolated from the conductive surface.

According to the present invention, a composite antenna structure includes an isolated coil and an active coil. The isolated coil is inductively linked to an active coil. Typically, tuning capacitances are connected to each of the coils. Typically, one end of the active coil is connected to ground, and the conductive surface of the MRI magnet apparatus is also connected to ground. The isolated coil, with its connected tuning capacitance, forms a closed loop circuit. The isolated coil is not conductively coupled to ground. Where the composite antenna is used as a transmitting antenna for sending RF excitation into the subject receiving space, the active coil is connected to the RF signal output of the RF transmitter. Conversely, the composite antenna can be used as a receiving antenna in which case the other end of the active coil is connected to the signal input of a receiver.

In general, the degree of electromagnetic coupling between an antenna structure and an object such as a patient disposed within the subject receiving space increases as the number of windings in the antenna structure increases. In the preferred antenna structures according to the present invention, some of the windings are provided in the form of isolated coils. In these preferred composite structures, the effect of stray capacitance is substantially lower than in a comparable antenna structure in which some windings are placed geometrically at the same location, but all of the windings are connected as part of a single, active coil.

DETAILED DESCRIPTION OF THE PREFERRED EMBODIMENTS

Figure 1:
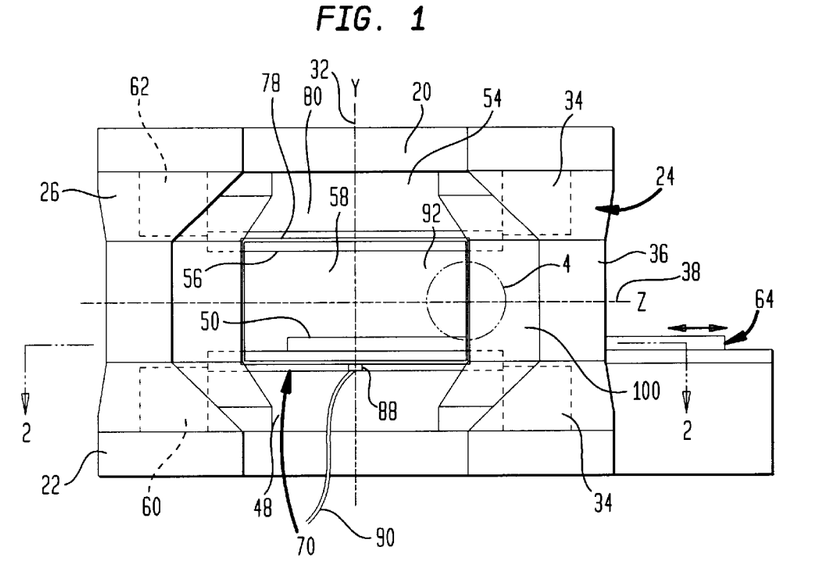
FIG. 1 is an elevational view depicting portions of apparatus in accordance with one embodiment of the invention.

Apparatus in accordance with one embodiment of the invention includes a primary field magnet of the type disclosed in co-pending, commonly assigned U.S. patent application Ser. No. 07/952,810 filed Sep. 28, 1992 entitled Ferromagnetic Yoke Magnets for Medical Magnetic Resonance Studies, the disclosure of which is hereby by reference herein. The primary field magnet includes an upper pole piece support 20 and a lower pole piece support 22 extending in generally parallel, horizontal planes. The pole piece supports are connected to one another by four columns 24, 26, 28 and 30 extending generally vertically between the supports and spaced apart from one another at substantially equal spacings around a central vertical axis 32. As further described in the '810 application, each column includes end portions 34 which are broad in the circumferential direction around the vertical axis and relatively narrow in the radial direction towards and away from the vertical axis, the end portions being disposed adjacent pole supports 20 and 22. Each column also includes a mid-section 36 of substantially square cross section with substantially equal radial dimension $D_r$ and circumferential dimensions $D_c$. The radial dimensions of the mid-section 36 are greater than the radial dimensions of the end sections 34, whereas the circumferential dimensions of the mid-sections 36 are smaller than the circumferential dimensions of end sections 34. As best appreciated with reference to FIG. 1, the columns taper inwardly in the circumferential direction towards the middle of the apparatus.

Figure 5:
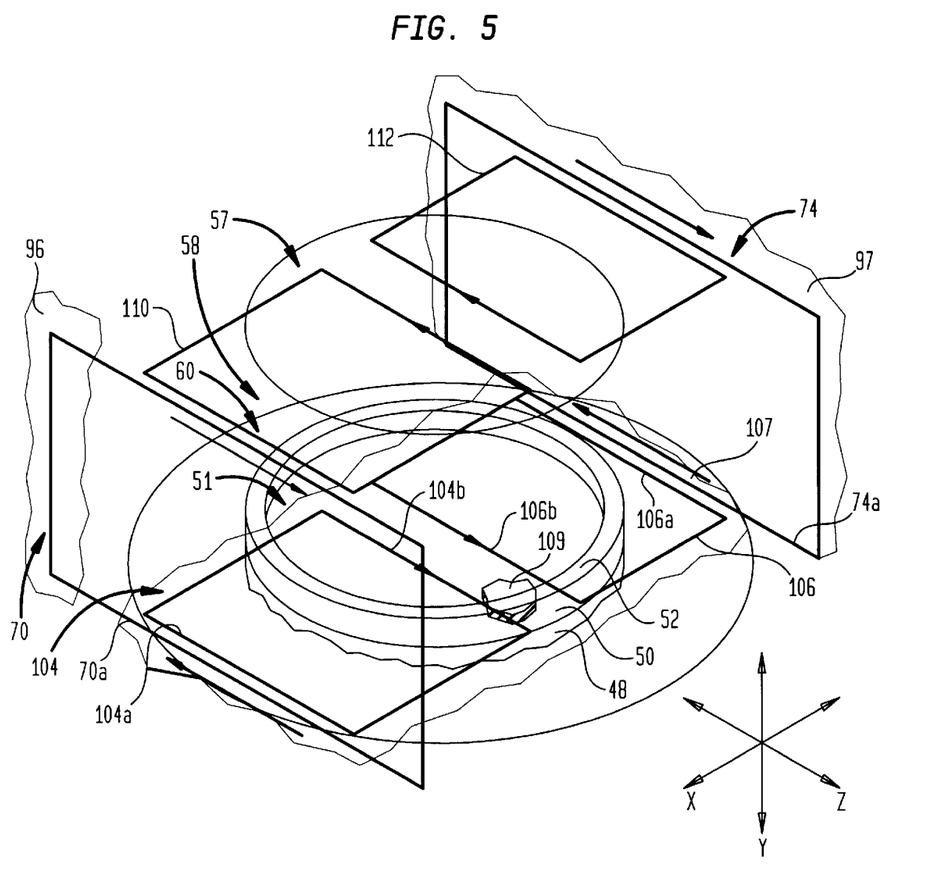
FIG. 5 is a diagrammatic perspective view of the antenna structure used in the apparatus of FIGS. 1–4.

The columns define openings 40, 42, 44 and 46 between them. The tapering shape of the columns makes each opening wider adjacent the medial horizontal plane 38 of the apparatus. A ferromagnetic lower pole stem 48 extends upwardly from lower pole piece support 22. A ferromagnetic pole piece 50 is disposed on the top of lower pole stem 48. As best seen in FIG. 5, lower pole piece 50 is substantially in the form of a circular disk lying in a horizontal plane, and has an upstanding rim or shim bar 52 protruding around the periphery of the disk. The lower pole piece defines a generally horizontal lower pole surface 51. The ferromagnetic material of the lower pole piece has appreciable electrical conductivity, and hence lower pole surface 51 is a surface of electrically conductive material. A similar ferromagnetic upper pole stem 54 (FIG. 1) and pole piece 56 extend downwardly from upper pole piece support 20. The upper pole piece 56 defines a generally horizontal upper pole surface 57, shown in phantom in FIG. 5 for clarity of illustration. The pole stems and pole pieces are substantially symmetrical about the central vertical axis 32 of the frame. The confronting pole pieces 50 and 56 cooperatively define a subject receiving space 58 between them, within the circumferentially spaced array of columns 24, 26, 28, and 30. Openings 40–46 provide communication between this subject receiving space 58 and the exterior of the frame. The surfaces of the pole pieces confronting one another from the top and bottom of space 58 extend generally horizontally and parallel to one another.

A pair of primary field coils 60, 62 encircle pole stems 48, 54 adjacent to the upper and lower pole piece supports 20 and 22. These primary field coils are arranged so that upon application of currents through the coils, a magnetic field is generated in vertical directions, parallel to the central axis 32. The flux constituting the field passes through space 58 between poles 50 and 56 and return, in the opposite direction, through columns 24–30. The columns thus act as flux return members between the poles. As described in the aforesaid '810 application, the field generated by coils 60 and 62 is a substantially homogeneous field of uniform strength throughout a large portion of subject receiving space 58. Conventional gradient coils (not shown) are provided adjacent the surfaces of pole pieces 50 and 56 for inducing gradients in the magnetic field. Also, a patient receiving bed 64 formed from non-magnetic, preferably polymeric materials is arranged for sliding movement into and out of space 58 through one of the openings 46 between columns 30 and 24.

Figure 4:
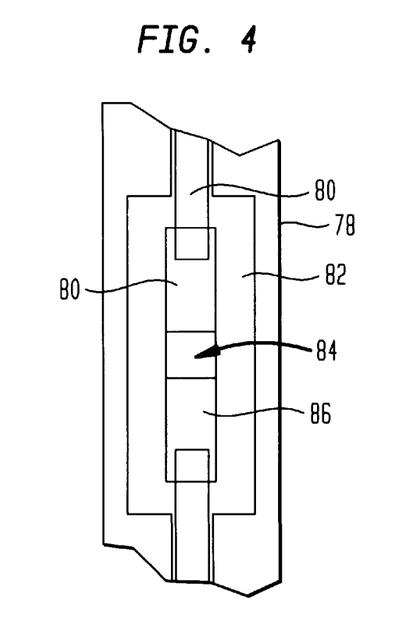
FIG. 4 is a fragmentary elevational view depicting a portion of the apparatus as indicated in FIG. 1.

The antenna structure includes an a pair of active loop coils 70 and 74 mounted to the frame. Loop coil 70 includes a generally planar, hollow rectangular frame 78 formed from a dielectric material such as a polymer. Preferred polymers are fire-resistant polymers such as polyvinyl chloride, polytetrfluoroethylene ("PTFE") and fluorinated ethylene propylene ("FEP") and other fluoropolymers and chloropolymers. Polymers having low dielectric constants are particularly preferred. A tubular conductor 80 extends substantially around the rectangular perimeter of frame 78. On the scale depicted in FIG. 1, the conductor 80 has the same shape as frame 78. As best seen in FIG. 4, conductor 80 is interrupted along one side and a pocket 82 is formed in frame 78. A capacitor 84 is physically disposed within pocket 82 and electrically connected between ends of conductor 80 by metallic ribbon cables 86. Loop coil 70 is also connected, by a conventional impedance matching circuit and connector 88 to a RF power cable 90. Power cable 90 extends to the other transmitting circuit components discussed below.

Coil 70 defines an interior opening or coil bore 92 aligned with opening 40 between columns 24 and 26. For use as a whole body scanner, this interior coil bore has the smallest dimension greater than about 28 cm and preferably has an area of about 784 cm$^2$ or more. More preferably, the smallest dimension of the coil bore is at least about 35 cm. Thus, interior opening 92 of coil 70 encircled by conductor 80 has a size sufficient to permit passage of a normal, adult human. Moreover, opening 92 extends upwardly and downwardly beyond pole pieces 50 and 56 and extends horizontally substantially through the full extent of opening 40, between the central portions 36 of columns 24 and 26. Thus, coil 70 does not substantially restrict the size of a person or other object which can be advanced into subject receiving space 58. The antenna structure further includes a active loop coil 74, identical in structure to coil 70 but mounted in the opposite opening 44 of the frame, between columns 28 and 30.

Figure 3:
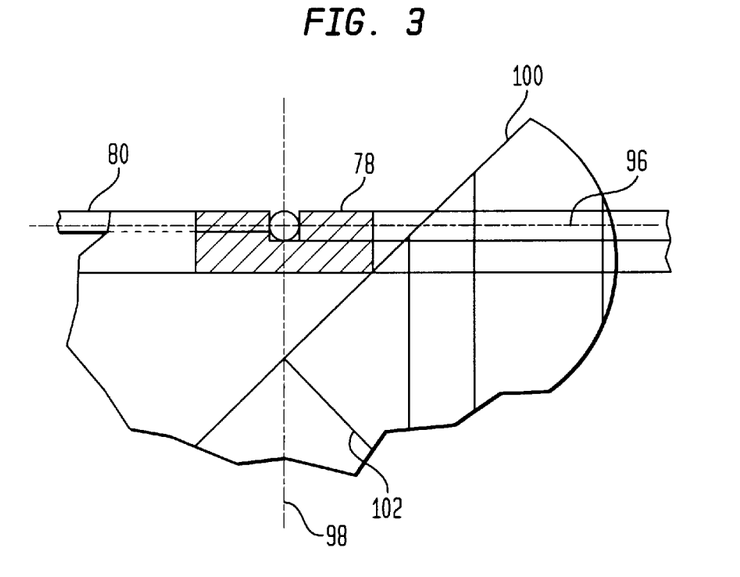
FIG. 3 is a fragmentary sectional view taken on an enlarged scale depicting a portion of the apparatus as indicated in FIG. 2.

Active loop coil 70 defines a planar coil surface 96 (FIGS. 3 and 5). As used in this disclosure with reference to a loop-like coil, the term "coil surface" means the surface defined by the center line of the conductor constituting the loop. Where several conductors extend in parallel around the loop, the center line of the conductor should be taken as the line corresponding to the center line of the cross combined area of the parallel conductors when seen in cross section on a plane perpendicular to the lengthwise extent of the conductors. In the simple case of a planar loop coil such as active loop coil 70, the coil surface is simply the plane in which the center line of coil conductor 80 is positioned. Coil surface 96 is substantially transverse to the horizontal, lower pole surface 51 defined by pole piece 50 and is also substantially transverse to the horizontal upper pole surface 57 surface of pole piece 56. The coil surface is also substantially transverse to the horizontal upper surface of the lower primary field coil 60 and substantially transverse to the horizontal lower surface of the upper primary field coil 62. As best seen in FIG. 5, coil surface 96 is remote from the lower pole surface 51 and from the upper pole surface 57.

Figure 2:
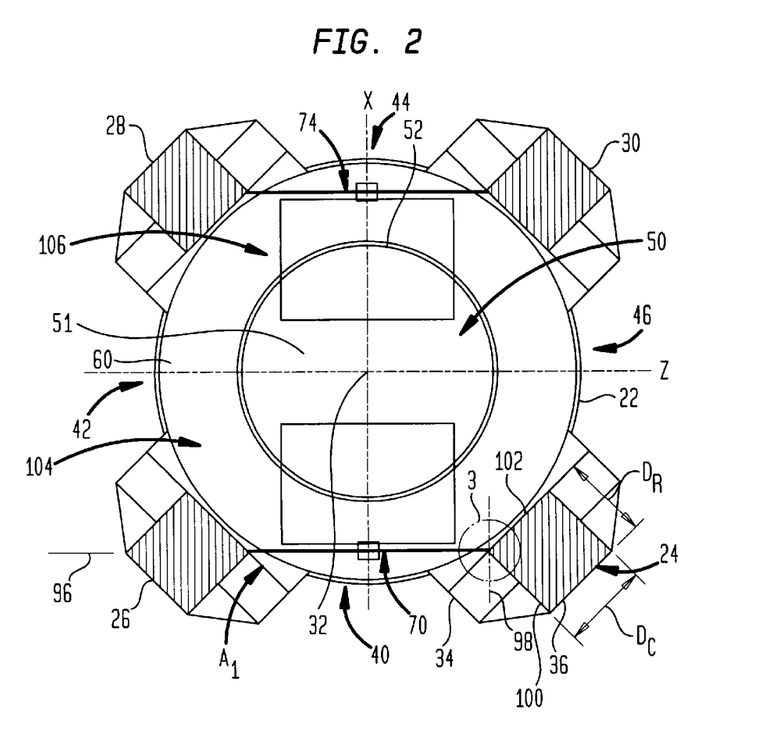
FIG. 2 is a sectional view taken along line 2—2 in FIG. 1, with portions omitted for clarity of illustration.

As best appreciated with reference to FIGS. 2 and 3, the coil surface 96 is also substantially transverse to the surfaces of columns 24 and 26 which are adjacent to the edges of the coil. The surfaces 100, 102 of column 24 extending along a vertical edge of coil 70 lie at oblique angles to the plane of coil surface 96. However, considering the average direction of the column surfaces 100 and 102 over a region encompassing a few centimeters on either side of plane 96, the average direction of the column surfaces 100, 102 is in a plane 98 substantially perpendicular to loop coil plane 96. In determining whether a coil surface is transverse to a surface of the primary field magnet as used in this disclosure, the direction of any surface of the magnet should be considered as the average direction of such surface within about 10 cm of the closest approach of such surface to the coil surface. As used herein, the coil surface should be understood as disposed substantially transverse to the surface of the primary field magnet frame or other component of the primary field magnet if the angle between the surfaces is about 30° or more.

The vertically extending edges of coil 70 extend along vertically extending edges of columns 24 and 26 and the surfaces of the columns slope away from the edges of the coils. Thus, the coil and the columns are in substantially edge to edge disposition.

The second active loop coil 74 is disposed in the same relationship to the frame, but in alignment with the other openings 44. Thus, the coil surface 97 of the second active loop coil 74 extends generally transverse to the pole surfaces 51 and 57, and generally transverse to the surfaces of the adjacent columns. Each coil is in substantially edge-to-edge disposition with the adjacent columns. Second active loop coil 74 is provided with a power cable similar to the power cable 90 associated with coil 70.

The antenna structure further includes a pair of lower isolated loop coils 104 and 106 overlying lower pole piece 50. These loop coils lie in a substantially horizontal plane and define a common coil surface 107 perpendicular to the coil surfaces 96 and 97 of active coils 70 and 74 and parallel to the lower pole surface 51. The windings of lower isolated loop coils 104 and 106 extend parallel to and in proximity to the lower pole surface 51. The windings of the lower isolated loop coils also overlie the top surface of the lower primary field coil 60. The isolated loop coils are spaced from the conductive elements of the frame and winding by dielectric insulation 109. Only a small portion of the insulation is depicted in FIG. 5; the remainder is omitted for clarity of illustration. The windings of each lower isolated loop coil may be mounted on a dielectric frame (not shown) or otherwise held in the desired shape. The windings of lower isolated loop coil 104 extend in a rectangle with a first side 104a disposed adjacent and parallel to a lowermost side 70a of active coil 70. A second, opposite side 104b of the isolated loop coil lies remote from active coil 70 and close to the middle of pole surface 51. The other isolated loop coil 106 likewise has a first side 106a adjacent the lower run 74a of active coil 74, and a second side 106b adjacent the middle of pole surface 51.

Figure 6:
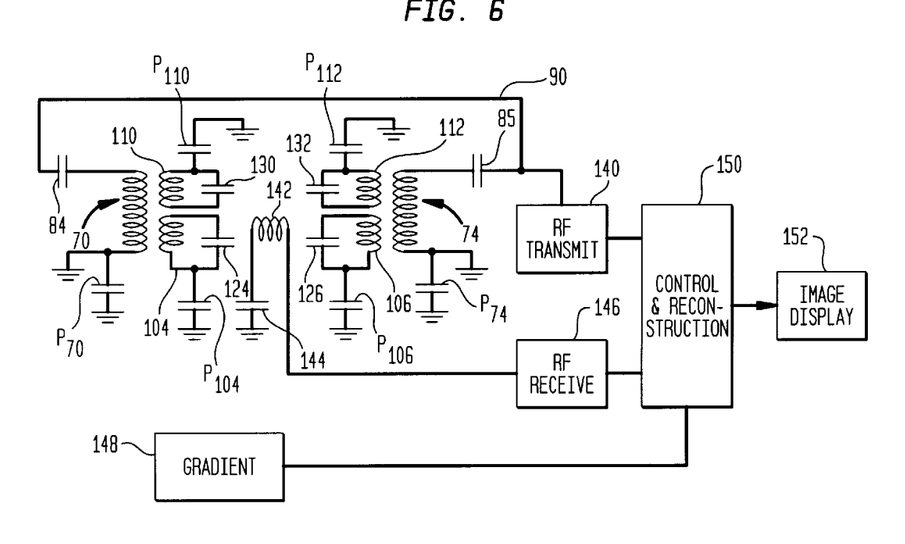
FIG. 6 is a schematic circuit diagram of the apparatus of FIGS. 1–5.

The antenna structure further includes a pair of upper isolated loop coils 110 and 112. These are disposed adjacent the upper pole surface 57. In other respects, the upper loop coils are identical to the lower isolated loop coils. As best seen in FIG. 6, each of the isolated loop coils 104, 106, 110, 112 has a tuning capacitor 124,126,130,132, respectively connected the loop coil. Each loop coil and its associated tuning capacitor is connected as a closed loop circuit which is not conductively connected to any other element of the apparatus. Each closed loop coil has parasitic capacitance to the adjacent pole surface and other adjacent conductive elements of the frame; these are represented as $P_{104}$, $P_{106}$, $P_{110}$ and $P_{112}$, respectively in FIG. 6.

One end of each active loop coil 70 and 74 is conductively connected to ground potential, as by connecting the coil end to a metallic element of the magnet frame. Tuning capacitor 84 is connected in series with the first active loop coil 70, whereas a similar tuning capacitor 85 is connected in series with the second active loop coil 74. The active loop coils also have parasitic capacitances $P_{70}$ and $P_{74}$ to ground.

The active loop coils are connected to the output of a radiofrequency transmitter 140, through RF power cable 90. The active coils are inductively coupled to the isolated loop coils. The first active loop coil 70 is coupled principally to the adjacent isolated coils 104 and 110, whereas the second active coil 74 is coupled principally to the other isolated coils 106 and 112. The capacitances of the tuning capacitors are selected such that all elements of the antenna structure are resonant at the frequency employed by the RF transmitter. As pointed out above, and as described mathematically in the Appendix of the present specification, the absence of a conductive connection between the isolated coils and ground substantially reduces the parasitic capacitances $P_{104}$, $P_{106}$, $P_{110}$ and $P_{112}$ associated with the isolated coils. Thus, even if the isolated coils are disposed close to the pole surfaces, the parasitic capacitances remain low enough that the system can be tuned to the resonant frequency needed for operation at fields of 3 kilogauss or about 6 kilogauss, such as about 12 to about 25 megahertz or higher.

The apparatus further includes an RF receiving coil 142 and tuning capacitor 144 connected to an RF receiver 146, as well as conventional magnetic field gradient generation apparatus 148. The transmitter, receiver and gradient field apparatus are linked to conventional control and image reconstruction apparatus 150. This apparatus is arranged to actuate the transmitter to apply RF excitation power during preselected intervals through the active coils 70 and 74. The RF power is inductively coupled to the isolated loop coils 104, 106, 110 and 112, so that RF power is radiated into the subject-receiving space 58. Thus, a medical patient or other subject may be irradiated with RF, and will reradiate magnetic resonance signals. In the normal manner, the system applies field gradients to spatially encode the magnetic resonance signals. The magnetic resonance signals from the subject are received by coil 142 and receiver 146. Control and reconstruction unit 150 uses the spatially-encoded magnetic resonance signals to construct an image of the subject, or to deduce other information about the subject. The image or other information is displayed on unit 152.

Figure 7:
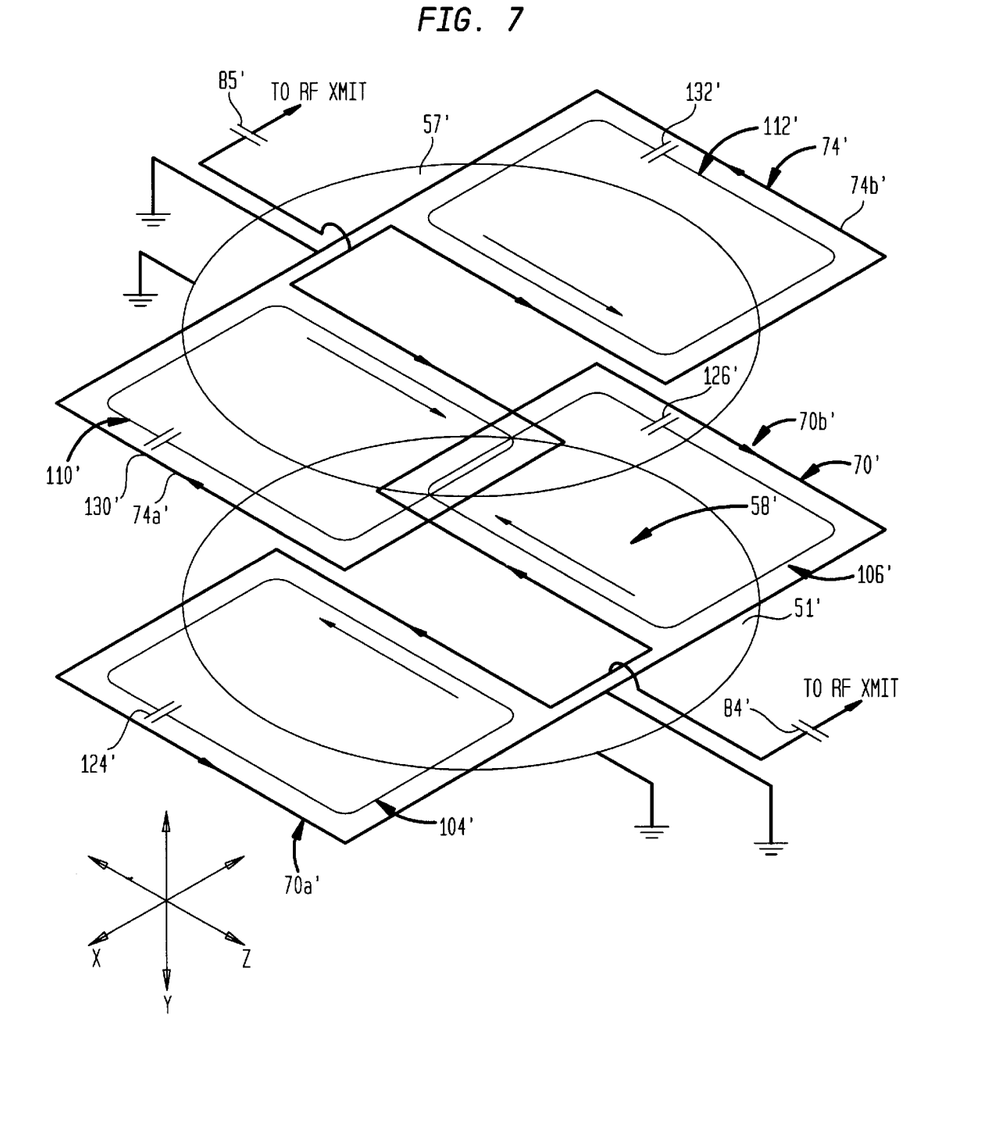
FIG. 7 is a diagrammatic perspective view depicting an antenna structure in accordance with a further embodiment of the invention.

FIG. 7 depicts an antenna assembly in accordance with a further embodiment of the invention. The ferromagnetic frame and other components of the primary field magnet assembly are not shown in detail. Only the lower pole surface 51' and upper pole surface 57' are schematically depicted in FIG. 6. The antenna assembly includes a pair of lower isolated loop coils 104' and 106' substantially similar to those discussed above in connection with FIGS. 1–5. Here again, the isolated loop coils extend in a common, substantially horizontal coil surface. Here again, each lower isolated loop coil is substantially rectangular and has windings extending parallel to the lower pole surface 51'. The lower isolated loop coils 104' and 106' are provided with tuning capacitors 124' and 126', respectively. The assembly further includes upper isolated loop coils 110' and 112', with their respective tuning capacitors 130' and 132'. These elements are also similar to the isolated loop coils discussed above. They extend in proximity to the upper pole surface 57'.

In this assembly, the active coils define horizontal coil surfaces, substantially coplanar with the coil surfaces of the isolated loop coils. Thus, the assembly includes a first or lower active coil 70'. Coil 70' includes a first, generally rectangular loop extending around first isolated loop coil 104. As seen in FIG. 7, the windings in the first loop 70a' extend parallel and adjacent to the windings of the first isolated loop coil 104' over substantially the entire circumference of the isolated loop coil. Similarly, a second loop 70b' of active coil 70' encircles isolated loop coil 106' over substantially its entire circumference. Loops 70a' and 70b' are electrically connected in parallel to one another. The parallel-connected loops are connected in series with a tuning capacitor 84' and the entire assembly is connected between the transmitter (not shown) and the ground potential of the frame, i.e., the potential of the conductive pole surfaces 51' and 57'.

The assembly further includes a second or upper active loop coil 74' with a substantially horizontal coil surface coplanar with the coil surface of upper isolated loop coils 110' and 112'. The second active loop coil also has a first loop 74a' encircling one upper isolated loop coil 110' and a second loop 74b' encircling the other upper isolated loop coil 112'. Here again, the conductors of the active coil extend parallel to and adjacent to the conductors of the isolated loop coils. The loops of the upper active coil are also connected in parallel with one another and in series with a tuning capacitor 85'. This series connected assembly is also connected between ground potential and the RF transmitter.

In this arrangement, as in the arrangement discussed above, the isolated loop coils, which are not connected to the ground potential of the ferromagnetic frame, have relatively low parasitic capacitance per unit length. Therefore, the antenna assembly as a whole has substantially lower parasitic capacitance than a comparable assembly would have if the isolated loop coils were formed as additional turns of the active coils. The inductive coupling between the isolated loop coils and the active coils will act to drive the isolated loop coils with the RF signal applied to the active coils. The assembly provides effective RF irradiation of the patient receiving space 58' between the pole surfaces.

Numerous variations and combinations of the features discussed above can be utilized without departing from the present invention. Thus, the present antenna assemblies can be used as RF receiving antennas for receiving the magnetic resonance signals from a patient disposed in the subject receiving space. Switching arrangements can be provided for selectively connecting the active coils up to the transmitter during transmit intervals and to a receiver during receive intervals of the MRI cycle. Alternatively, the antenna assemblies in accordance with the embodiments discussed above can be used solely as receive antennas and a separate RF transmitting antenna can be provided. Further, the RF antenna assemblies discussed above can be utilized in conjunction with field magnet structures differing from those illustrated in the drawings. For example, the antenna structures can be used with magnet structures which employ permanent magnets or superconducting magnets to supply the primary field. The coil assemblies can also be varied. For example, the antenna assembly may include greater or lesser numbers of active coils and isolated loop coils, but at least one of each must be provided. Ordinarily, it is desirable to provide substantially uniform RF irradiation or reception throughout the patient receiving space. The particular antenna assemblies discussed above are symmetrical about planes passing through the center of the subject receiving space. However, such symmetry is not an absolute requirement if non-uniform reception or irradiation can tolerated. Also, the embodiments discussed above utilize discrete tuning capacitors to provided capacitance in series with the coils. Distributed capacitance, including the parasitic capacitance to the frame, can be substituted for all or part of the discrete capacitors. As these and other variations and combinations of the features discussed above can be utilized, the foregoing description of the preferred embodiment should be taken by way of illustration rather than by way of limitation of the present invention.

The appendix set forth below describes certain theoretical principles related to the invention.

Appendix

Planar Coils

Figure 8:
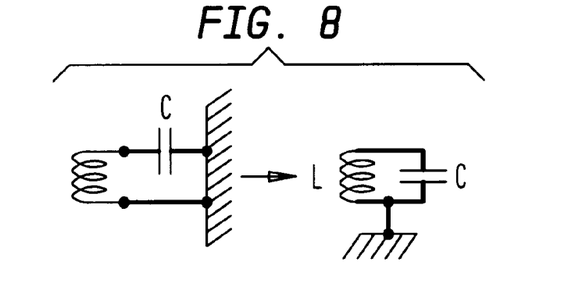
FIGS. 8, 9 and 10 are schematic circuit diagrams depicting theoretical electrical circuits.

If a planar (i.e. flat) coil is positioned parallel to a grounded conductive plane at a small distance, there will be a stray capacitance between the coil and the conductive plane. The RF current in the coil will be shunted to the ground. Moreover, the induced eddy currents in the conductive plane will reduce the self-inductance of the coil. As a result, the functionality of the circuit will be degraded. To reduce the circuit degradation it is important to reduce the stray capacitance. This can be accomplished partially by balancing the coil with respect to the ground plane. The stray capacitance is a distributed quantity measured in picofarads per unit length of the coil conductor. For qualitative considerations an equivalent, effective, lumped stray capacitance and equivalent lumped circuits are useful. FIG. 8 shows a coil of self-inductance L connected to the conductive plane at one of its ends with the other end floating. The capacitor C represents the total stray capacitance.

Figure 9:
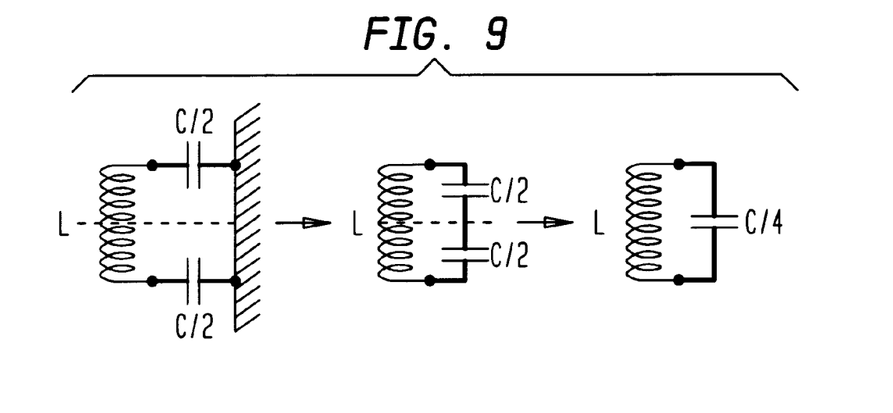

FIG. 9 shows the situation in which the connection to the conductive plane is removed. The coil is then symmetrical with respect to the plane with the zero potential (virtual ground) in its center. As indicated in FIG. 9 the stray capacitance is reduced by factor 4. For the circuit to work properly we must have $C_{TM} \gg C$, where $C_{TM}$ is the capacitance of the tuning and matching network. Only in this case the Q value of the circuit will be high and the resonance tank current can be excited in the coil with a low RF power consumption.

Inductively Coupled Flat Transmitter Coils

Figure 10:
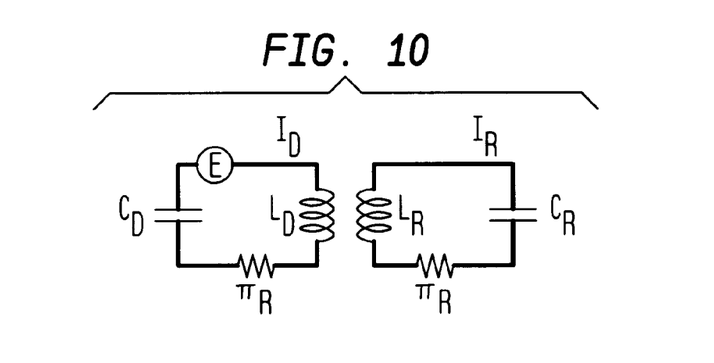

The embodiment shown in FIG. 7. utilizes flat coils 110' and 112' balanced with respect to the ground. These passive coils (also referred to as isolated loop coils) are geometrically very similar to the primary or active coils 74' and they are very close to them. The RF currents in the primary coil, 74 and the passive coil such as 110' are determined by the set of general basic equations given in the Appendix of copending, commonly assigned U.S. patent application Ser. No. 08/683,623 for a "driver" and a "re-transmitter" configured as shown in FIG. 10. These equations are:

$$E = Z_D I_D + jwM I_R, \quad (1)$$

$$0 = jwM I_D + Z_R I_R. \quad (2)$$

In these equations, w is the angular velocity, $I_D$ is the current in the principal transmitting antenna or "driver" induced by the electromotive force E, supplied by the transmitter across the capacitance $C_D$ of the driver or principal antenna circuit. $L_D$ is the inductance of the driver coil or coils, $r_D$ is the effective series resistance in the driver circuit (includes all losses), $I_R$ is the current induced in the re-transmitter coil, $L_R$ is the re-transmitter inductance. $C_R$ is the capacitance in the re-transmitter circuit. $r_R$ is the effective series resistance of the re-transmitter circuit (includes all losses, primarily due to the loading of the re-transmitter coil by the subject or patient), M is the mutual inductance between the driver coil and the re-transmitter coil.

The transmitter should be optimized for maximum field homogeneity by properly dimensioning the coil system geometry and by adjusting the currents $I_D$ and $I_R$. For simplicity, let us consider a transmitter coil system in which the active coil or driver (e.g., 74', FIG. 7) and the re-transmitter or isolated loop coil (e.g., 110', FIG. 7) have substantially the same form and size so that $L_D$ (coil 74')$\cong L_R$ (coil 110') and they are closely spaced. Then the coupling coefficient $0 \leq k \leq 1$ is practically $k \cong 1$ and the mutual inductance $$M = k\sqrt{L_D L_R} \cong \sqrt{L_D L_R}$$

Because of $L_R \cong L_D$ we have $M \cong L_R (\cong L_D)$, or simply $$M = L_R \quad (3)$$

We set the currents $I_R$ and $I_D$ to be the same, differing only by some, yet to be found, phase difference $\phi$, $$I_D = I_R e^{j\phi}, \quad (4)$$

Inserting (4) into (2) we obtain $(jwMe^{j\phi} + Z_R) = 0$.
Using $Z_R = r_R + j(wL_R - 1/wC_R)$, we get $$j\{w(M \cos \phi + L_R) - 1/wC_R\} + r - wM \sin \phi = 0, \text{ or}$$

$$r - wM \sin \phi = 0, \quad (5)$$

$$w(M \cos \phi + L_R) - 1/wC_R = 0. \quad (6)$$

From (5) we see that $\sin \phi = r_R/wM$
but $wM/r_R \cong wL_R/r_R = Q_R$. The Q value of $L_R$ tank circuit is typically $Q_R = 100$. Therefore $\sin \phi \cong 0$.

The current $I_R$ and $I_D$ are in phase. Equation (6) determines the resonant frequency f of the isolated loop coils 104', 106', 110' and 112':

$$f = \frac{1}{2\pi\sqrt{(M + L_R)C_R}} \cong \frac{1}{2\pi\sqrt{2L_R C_R}}$$

Equation (1) determines the current $I_D$. For $I_R = I_D$, $L_R = L_D = M$ this current has a resonant maximum if the tuning capacitors $C_D$ and $C_R$ are set to be equal $C_D = C_R$.

We claim:

1. Magnetic resonance apparatus comprising:

(a) field applying apparatus including means for defining a subject-receiving space, and means for directing magnetic flux into said subject-receiving space, said field applying apparatus including an electrically conductive element defining a conductive surface adjacent the subject-receiving space;

(b) a composite antenna for transmission of radiofrequency ("RF") radiation into said subject-receiving space or reception of radiofrequency radiation from said subject-receiving space, said composite antenna including an active coil and an isolated loop coil which is not conductively connected to said conductive surface, at least a part of said isolated loop coil being disposed adjacent to said conductive surface, said isolated loop coil being inductively coupled to said active coil; and (c) a transmitter or receiver connected said active coil.

2. Magnetic resonance apparatus comprising:
 (a) field applying apparatus including means for defining a subject-receiving space, and means for directing magnetic flux into said subject-receiving space, said field applying apparatus including an electrically conductive element defining a conductive surface adjacent the subject-receiving space;
 (b) a composite antenna for transmission of radiofrequency ("RF") radiation into said subject-receiving space or reception of radiofrequency radiation from said subject-receiving space, said composite antenna including an active coil and an isolated loop coil which is not conductively connected to said conductive surface, at least a part of said isolated loop coil being disposed adjacent, to said conductive surface, said isolated loop coil being inductively coupled to said active coil; and
 (c) a transmitter or receiver connected said active coil, wherein the field applying apparatus includes a structure defining an electrically conductive pole surface facing towards said subject receiving space and a source of magnetic flux associated with said structure for application of a substantially constant primary magnetic field in said subject receiving space through said pole surface and wherein at least a part of said isolated loop coil overlies said pole surface.

3. Magnetic resonance apparatus comprising:
 (a) field applying apparatus including means for defining a subject-receiving space, and means for directing magnetic flux into said subject-receiving space, said field applying apparatus including an electrically conductive element defining a conductive surface adjacent the subject-receiving space;
 (b) a composite antenna for transmission of radiofrequency ("RF") radiation into said subject-receiving space or reception of radiofrequency radiation from said subject-receiving space, said composite antenna including an active coil and an isolated loop coil which is not conductively connected to said conductive surface, at least a part of said isolated loop coil being disposed adjacent to said conductive surface, said isolated loop coil being inductively coupled to said active coil; and
 (c) a transmitter or receiver connected said active coil, wherein said active coil is conductively connected to said conductive surface.

4. Apparatus as claimed in claim 3 wherein said active coil and said conductive surface are both conductively connected to a common ground potential.

5. Magnetic resonance apparatus comprising:
 (a) field applying apparatus including means for defining a subject-receiving space, and means for directing magnetic flux into said subject-receiving space, said field applying apparatus including an electrically conductive element defining a conductive surface adjacent the subject-receiving space;
 (b) a composite antenna for transmission of radiofrequency ("RF") radiation into said subject-receiving space or reception of radiofrequency radiation from said subject-receiving space, said composite antenna including an active coil and an isolated loop coil which is not conductively connected to said conductive surface, at least a part of said isolated loop coil being disposed adjacent to said conductive surface, said isolated loop coil being inductively coupled to said active coil; and
 (c) a transmitter or receiver connected said active coil, wherein said isolated loop coil includes a winding defining an isolated loop coil surface overlying said conductive surface and extending generally parallel thereto.

6. Apparatus as claimed in claim 5 wherein said winding of said isolated loop coil is disposed within about 10 cm of said conductive surface.

7. Apparatus as claimed in claim 5 wherein said active coil includes a winding defining an active coil surface, at least a part of the winding of the active coil overlying the conductive surface and extending generally parallel thereto.

8. Apparatus as claimed in claim 5 wherein said winding of said active coil extends adjacent to the winding of the isolated loop coil and substantially parallel to the winding of the isolated loop coil over at least a portion of the length of the isolated loop coil.

9. Apparatus as claimed in claim 8 wherein said coil surface of said active coil is substantially perpendicular to said conductive surface.

10. Apparatus as claimed in claim 8 wherein said active coil is disposed remote from said conductive surface.

11. Apparatus as claimed in claim 8 wherein said winding of said active coil extends substantially parallel to the isolated loop coil winding over substantially the entire length of said isolated loop coil winding.

12. Apparatus as claimed in claim 11 wherein said active coil includes first and second loops at least partially overlying said conductive surface, said loops being spaced apart from one another, said isolated loop coil being substantially encircled by said first loop, the apparatus further comprising a second isolated loop coil substantially encircled by said second loop.

13. Magnetic resonance apparatus comprising:
 (a) field applying apparatus including means for defining a subject-receiving space, and means for directing magnetic flux into said subject-receiving space, said field applying apparatus including an electrically conductive element defining a conductive surface adjacent the subject-receiving space;
 (b) a composite antenna for transmission of radiofrequency ("RF") radiation into said subject-receiving space or reception of radiofrequency radiation from said subject-receiving space, said composite antenna including an active coil and an isolated loop coil which is not conductively connected to said conductive surface, at least a part of said isolated loop coil being disposed adjacent to said conductive surface, said isolated loop coil being inductively coupled to said active coil; and
 (c) a transmitter or receiver connected said active coil, the apparatus further comprising means for providing an isolated loop coil tuning capacitance connected to said isolated loop coil and means for providing an active tuning capacitance connected to said active coil.

14. Magnetic resonance apparatus comprising:
 (a) field applying apparatus including means for defining a subject-receiving space, and means for directing magnetic flux into said subject-receiving space, said field applying apparatus including an electrically conductive element defining a conductive surface adjacent the subject-receiving space;
 (b) a composite antenna for transmission of radiofrequency ("RF") radiation into said subject-receiving, space or reception of radiofrequency radiation from said subject-receiving space, said composite antenna including an active coil and an isolated loop coil which is not conductively connected to said conductive surface, at least a part of said isolated loop coil being disposed adjacent to said conductive surface, said isolated loop coil being inductively coupled to said active coil; and (c) a transmitter or receiver connected said active coil, wherein said isolated loop coil is substantially in the form of a flat closed loop.

* * * * *

UNITED STATES PATENT AND TRADEMARK OFFICE
CERTIFICATE OF CORRECTION

PATENT NO. : 6,028,429
DATED : February 22, 2000
INVENTOR(S) : Green et al.

It is certified that error appears in the above-identified patent and that said Letters Patent is hereby corrected as shown below:

Column 5, line 6, cancel "an".
Column 5, line 23, "a" should read --an--.
Column 5, line 40, "a" should read --an--.
Column 5, line 59, cancel "surface".
Column 6, line 48, "104 a" should read --104*a*--.
Column 6, line 61, after "connected" insert --with--.
Column 8, line 65, after "can" insert --be--.
Column 10, line 37, "current" should read --currents--.
Column 10, line 47, after "equal" insert --,--.
Column 10, line 67, after "connected" insert --to--.
Column 11, line 15, cancel "," (first instance).
Column 12, line 64, cancel ",".

Signed and Sealed this

Twenty-fourth Day of April, 2001

*Attest:*

NICHOLAS P. GODICI

*Attesting Officer*   Acting Director of the United States Patent and Trademark Office